(12) United States Patent
Sun et al.

(10) Patent No.: US 8,426,960 B2
(45) Date of Patent: Apr. 23, 2013

(54) WAFER LEVEL CHIP SCALE PACKAGING

(75) Inventors: Ming Sun, Sunnyvale, CA (US); Tao Feng, Santa Clara, CA (US); François Hébert, San Mateo, CA (US); Yueh-Se Ho, Sunnyvale, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 163 days.

(21) Appl. No.: 11/963,690

(22) Filed: Dec. 21, 2007

(65) Prior Publication Data

US 2009/0160045 A1   Jun. 25, 2009

(51) Int. Cl.
*H01L 23/48* (2006.01)

(52) U.S. Cl.
USPC .......................................... 257/691; 257/341

(58) Field of Classification Search .................. 257/699, 257/700, E23.121, 788, 691, 779, 781, 798, 257/341
See application file for complete search history.

(56) References Cited

U.S. PATENT DOCUMENTS

| | | | | |
|---|---|---|---|---|
| 5,729,435 A * | 3/1998 | Iijima et al. | ................... | 361/704 |
| 6,133,634 A | 10/2000 | Joshi | ............................. | 257/738 |
| 6,271,060 B1 | 8/2001 | Zandman et al. | | |
| 6,469,384 B2 | 10/2002 | Joshi | ............................. | 257/738 |
| 6,528,393 B2 | 3/2003 | Tao | | |
| 6,545,316 B1 * | 4/2003 | Baliga | .......................... | 257/329 |
| 6,562,647 B2 | 5/2003 | Zandman et al. | | |
| 6,586,280 B2 * | 7/2003 | Cheah | ............................ | 438/122 |
| 6,689,640 B1 * | 2/2004 | Mostafazadeh | ............... | 438/121 |
| 6,767,820 B2 | 7/2004 | Standing et al. | .............. | 438/614 |
| 6,847,102 B2 * | 1/2005 | Gerber et al. | ................. | 257/668 |
| 6,903,441 B2 * | 6/2005 | Wang et al. | ................... | 257/620 |
| 7,233,043 B2 * | 6/2007 | Pattanayak | .................... | 257/341 |
| 2001/0048116 A1 | 12/2001 | Standing et al. | ............. | 257/177 |
| 2003/0052405 A1 | 3/2003 | Moriguchi | .................... | 257/706 |
| 2005/0014331 A1 * | 1/2005 | Yang et al. | .................... | 438/241 |
| 2005/0029588 A1 * | 2/2005 | Sakamoto et al. | ........... | 257/330 |
| 2006/0175700 A1 * | 8/2006 | Kagii et al. | ................... | 257/706 |

FOREIGN PATENT DOCUMENTS

JP   2000106382   *   4/2000

* cited by examiner

*Primary Examiner* — Steven Loke
*Assistant Examiner* — Kimberly M Thomas
(74) *Attorney, Agent, or Firm* — Joshua D. Isenberg; JDI Patent

(57) ABSTRACT

A method for making back-to-front electrical connections in a wafer level chip scale packaging process is disclosed. A wafer containing a plurality of semiconductor chips is mounted on a package substrate. Each semiconductor chip in the plurality includes one or more electrodes on an exposed back side. Scribe lines between two or more adjacent chips on the wafer are removed to form relatively wide gaps. A conductive material is applied to the back side of the semiconductor chips and in the gaps. The conductive material in the gaps between two or more of the chips is then cut through leaving conductive material on the back side and on side walls of the two or more chips. As a result, the conductive material provides an electrical connection from the electrode on the back side of the chip to the front side of the chip.

22 Claims, 3 Drawing Sheets

WAFER LEVEL CHIP SCALE PACKAGING

FIELD OF THE INVENTION

This invention relates to semiconductor packaging and more specifically relates to a low cost process of wafer level chip scale package (CSP).

BACKGROUND OF THE INVENTION

A low package resistance $R_{ds\text{-}on}$ and good performance is often desirable for semiconductor devices. This is particularly the case for metal oxide silicon field effect transistor (MOSFET) devices, especially vertical conduction power MOSFET devices having a gate and source electrode on one surface and a drain electrode on the opposite surface. It is also generally desirable to have simple, quick and efficient methods of packaging semiconductor devices. Thus, numerous packaging concepts and methods have been developed in the prior art.

While silicon process technology has advanced significantly in the past decade, for the most part, the same decades-old package technology continues as the primary packaging means. Epoxy or solder die attach along with aluminum or gold wire bonding to a lead frame is still the preferred semiconductor package methodology. Advances in semiconductor processing technology, however, have made parasitics (e.g., resistances, capacitances and inductances) associated with conventional packages more of a performance limiting factor. In the case of conventional flip chip technology, among other shortcomings, heat dissipation is essentially governed by the die size and connection to the back side of the die is not easily facilitated (often requiring a bond wire connection). These limitations (poor heat dissipation and resistive contact to back side) become quite significant in high current applications such as power switching devices.

U.S. Pat. No. 6,767,820 discloses a chip scale packaging of semiconductor MOS-gated device. The source side of a MOS-gated device wafer is covered with a passivation layer, preferably a photosensitive liquid epoxy, or a silicon nitride layer, or the like. The material is then dried and the coated wafer is exposed using standard photolithographic techniques to image the wafer and openings are formed in the passivation layer to produce a plurality of spaced exposed surface areas of the underlying source metal and a similar opening to expose the underlying gate electrode of each die on the wafer. The openings in the passivation layer are typically made through to a conventional underlying solderable top metal such as a titanium/tungsten/nickel/silver metal. After the openings are formed, the wafer is then sawn or otherwise singulated into individual die. The individual die are then placed source-side down and a U-shaped or cup shaped, partially plated drain clip is connected to the solderable drain side of the die, using a conductive epoxy or solder, or the like to bond the drain clip to the bottom drain electrode of the die. The bottoms of the legs of the drain clip are coplanar with the source-side surface (that is the tops of the contact projections) of the die. However, the U-shaped clip is usually made of a copper alloy with at least partially plated silver surfaces and is actually very thin. The clip, therefore, tends to be expensive. In addition, different U-shaped clips are needed for different die sizes or larger U-shaped clips are used for smaller die, which takes a lot space on the PC board.

US publication number 2003/0052405 discloses a vertical power MOSFET device having the source electrode and the gate electrode are connected to the lead frames by bonding material such as solder, and the drain electrode underlying the entire bottom surface of the chip is directly connected to the mounting substrate. The vertical MOSFET device is located upside down such that the drain electrode formed on the bottom surface of the silicon substrate will be connected to the lead frame above it whereas the gate electrode and the source electrode will be exposed to the bottom of the device. The MOSFET device is sealed by a resin, such as epoxy or silicone, such that the MOSFET device and an inner part of the lead frame are covered. On the bottom surface of the MOSFET device, the surface of the resin is approximately flush with surfaces of the lead frame and the drain electrodes. That is, on the bottom surface of the semiconductor device, the bottom surface of outer lead portions of the lead frame and bottom surfaces of drain electrodes are exposed for connection to a conductor land (mount surface) of the mounting substrate. Then the perimeter of these drain electrodes is covered by the resin.

U.S. Pat. No. 6,133,634 discloses a flip chip package having a power MOSFET device including a drain terminal, a source terminal and a gate terminal. The drain terminal connects to a conductive carrier and an outer array of solder balls. The source terminal and gate terminal connect to an inner array of solder balls. The conductive carrier and the outer array of solder balls provide electrical connection between the printed circuit board and the drain terminal.

U.S. Pat. No. 6,469,384 discloses a method of packaging semiconductor devices, such as MOSFET device, which does not require a molded body. The MOSFET device is coupled to a substrate such that the source and gate regions of the die are coupled to the substrate. The MOSFET device is placed on a printed circuit board (PCB) and the surface of the die is coupled directly to the PCB with solder paste or suitable electrically conductive interconnect, and thus serves as the drain connection. The surface of the die coupled to the substrate comprises the gate region and the source region of the die. Thus, the solder ball in the gate region of the substrate serves to couple the gate region of the die to the PCB while the remaining solder balls couple the source region of the die through the substrate to the PCB.

The preceding prior art package design for vertical power MOSFET devices can only provide the electrical interconnection for source, gate and drain for individual MOSFET at a time after singulation, which is expensive and time consuming. In addition the available space of the die is reduced. It would be desirable to produce a package design and process for its manufacture which permits batch handling with reduced equipment on the production line and lower costs.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

An example of a process of making electrical interconnections according to an embodiment of the present invention is illustrated in FIGS. 1A-1E and FIG. 2. FIGS. 1A-1E are a sequence of schematic diagrams illustrating a process 200 outlined in the flow diagram of FIG. 2 In this example, electrical interconnections are made at a drain side of trench MOSFETS in a wafer level chip scale package (CSP).

Figure 1A:
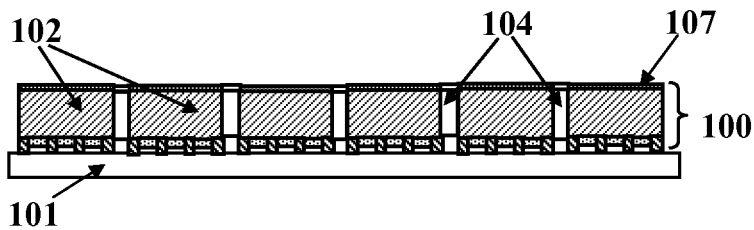
FIGS. 1A-1E are schematic diagrams illustrating a wafer level chip scale packaging process in which electrical connection are made at a drain side of trench MOSFETS.
Figure 1B:
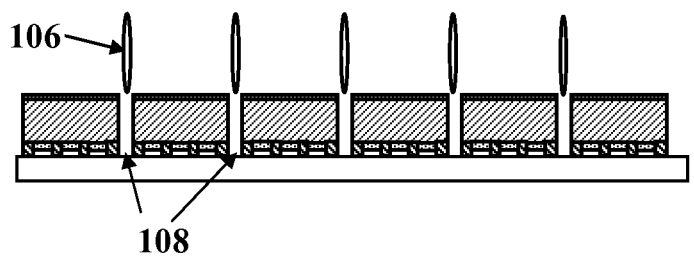
Figure 2:
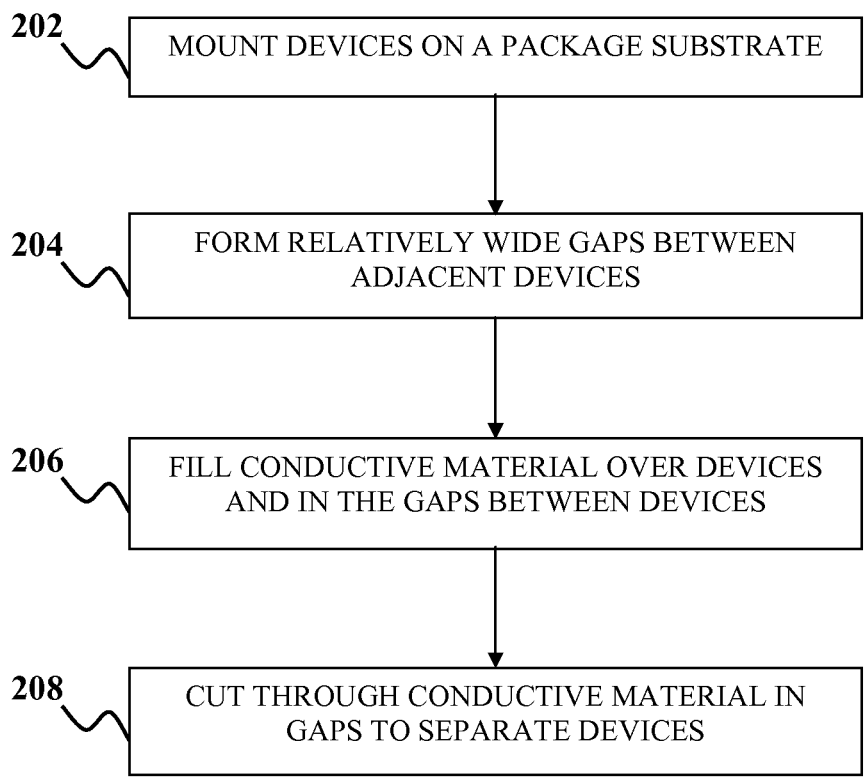
FIG. 2 is a flow diagram of a wafer level chip scale packaging process of the type shown in FIGS. 1A-1E.

Referring to FIG. 2, the method 200 may begin at 202 by mounting devices on a package substrate. For example, as shown in FIG. 1A, a semiconductor wafer 100 including a plurality of semiconductor chips 102, such as vertical MOSFETs, patterned on a surface thereof as a result of a wafer production process is prepared. Each chip includes a backside drain electrode 107 exposed to the top. The backside drain electrode 107 can be comprised of a standard backside metal such as Ti/Ni/Ag, CrAu, TiAu, etc. Alternatively, the electrode 107 can be comprised of an exposed backside portion of the substrate of the wafer 100, and not of metal. The exposed backside wafer substrate can optionally be doped and annealed to reduce contact resistance to a conductive material 110, which will be added later in the process. A scribe line 104 divides the semiconductor wafer 100 into the plurality of semiconductor chips 102. The wafer 100 is mounted to a package substrate 101. For example the wafer is mounted by tape if the wafer 100 is mounted to a carrier. Alternatively, the wafer may be mounted by vacuum if the wafer 100 is mounted to a vacuum chuck. The semiconductor chips 102 may include a front surface patterned with a land-grid array (LGA). As indicated at 204 in FIG. 2, the wafer may be section by forming relatively wide gaps between devices. By way of example, the scribe lines 104 between two semiconductor chips 102 may be removed using a thick bladed wafer saw 106 as shown in FIG. 1B forming the gaps 108 between two semiconductor chips 102. The thick bladed wafer saw 106 has a blade thickness of about 80 µm to 100 µm.

Figure 1C:
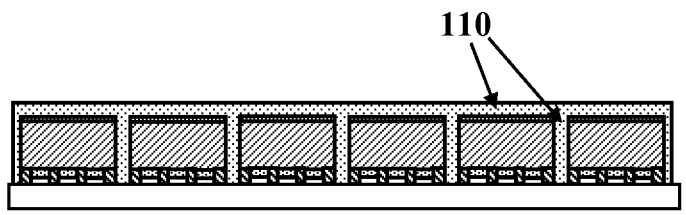
Figure 1D:
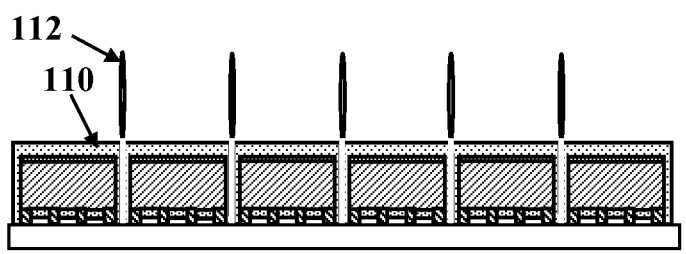

As indicated at 206 in FIG. 2, conductive material 110 may cover the devices and fill the gaps between devices. The conductive material 110 may cover four side walls of the semiconductor chip 102. By way of example, conductive epoxy of cast conductive material 110, is then filled into the gaps 108 and over the top of drain electrode 107 and on the side of the semiconductor chips 102 as shown in FIG. 1C. By way of example, the conductive material 110 may be a Carbon material, such as nano carbon or carbon nanotubes. Alternatively the conductive material 110 may be a conductive adhesive, conductive epoxy, solder or the like. The conductive material 110 is disposed on the back side and side walls of the semiconductor chips 102 in such a way as to provide an electrical connection from the drain electrode 107 on the back side of the chip 102 to the front side of the chip. For the case in which the backside electrode 107 is comprised of the wafer substrate and not of metal, a cleaning step may optionally be introduced before the conductive material 110 is deposited in order to reduce any contaminants or oxidation which might be found on the wafer surface, thus ensuring better contact between the backside electrode 107 and conductive material 110. The cleaning solution can comprise of dilute HF, solvents, vapor-HF, etc.

Figure 1E:
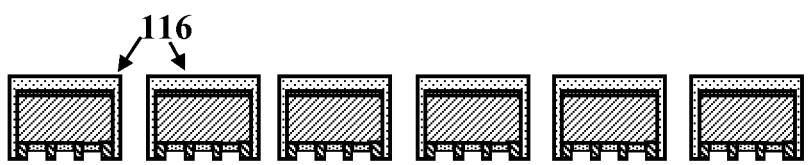

As indicated at 208 in FIG. 2, the devices may be separated from each other by cutting through the conductive material 110 in the relatively wide gaps 108 between the devices. By way of example, the semiconductor chips 102 may be singulated by cutting through the cured conductive material between the chips with a narrow-bladed saw 112 to separate the wafer 100 into individual semiconductor devices 116 as shown in FIG. 1E. Preferably, the narrow-bladed saw 112 has a blade thickness that is less than the width of the gaps 108, e.g., if the gaps are about 80 to 100 microns wide, the thin-bladed saw 112 may have a blade thickness of about 20 to 30 microns. As the result a layer of conductive material coated over the back side surface and the side wall surfaces not only brings electrical connection from the back side electrode to the front surface but also protects the chip side surfaces from scratching, chipping, and other mechanical damage during final product electrical testing, packing, board level mounting and transportation.

Figure 3:
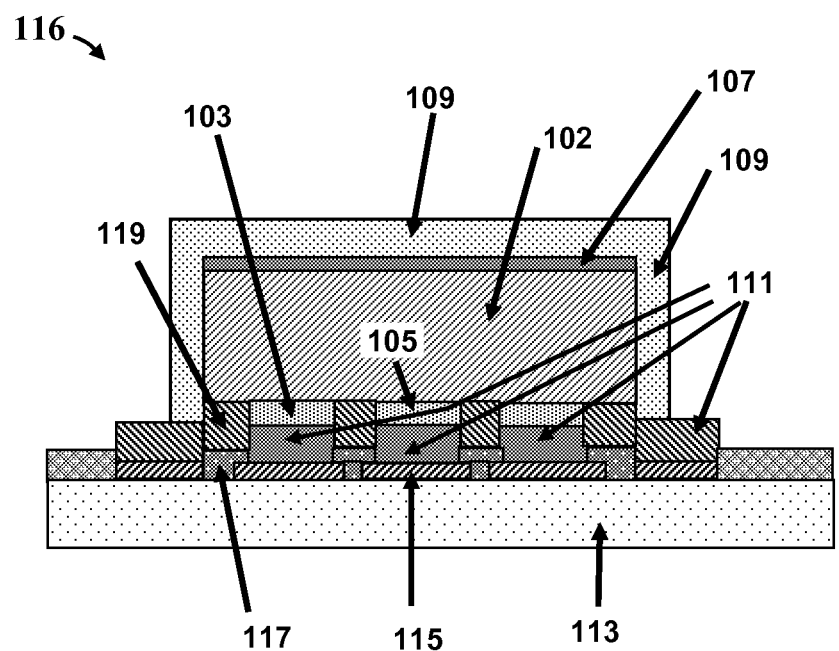
FIG. 3 is a schematic diagram illustrating a side view of a trench MOSFET having drain electrical connection made using the process shown in FIGS. 1A-1E.

FIG. 3 is a schematic diagram illustrating the electrical connection of an individual semiconductor device 116 formed by the process of FIGS. 1A-1E mounted to a printed circuit board (PCB) 113. As shown in FIG. 3, a semiconductor device 116 includes a semiconductor chip 102, which includes source electrodes 103 and gate electrodes 105 and drain electrode 107, and conductive epoxy or conductive casting materials 109 deposited on top of the drain electrode 107 and in the scribe line gaps 108. The conductive casting material 109 may cover four side walls of the semiconductor chip 102. The source electrodes 103 and gate electrode 105 are electrically connected to copper pads 115 on the PCB 113 through solder joints 111. Passivation or dielectric 119 may fill in gaps between the electrodes 103 and 105. A solder mask 117 may be positioned between the copper pads 115.

Embodiments of the present invention allow true wafer-level processed chip scale packaging (CSP) of semiconductor devices with back to front connections with a minimum of added cost. A conventional CSP system may be used with relatively minor modifications, e.g., a thicker saw blade to provide gaps between adjacent die and apparatus for applying the conductive material over and between the die. Embodiments of the present invention open the door for the use of nano carbon coatings or carbon nanotubes (CNT) in drain connections.

There is no minimum CSP size associated with embodiments of the present invention. The process used in embodiments of this invention is totally independent of die size, and there is no need to prepare any preformed conductive cap or film. Furthermore, there is no need for a stamped metal frame or a substrate and solder bumps for CSP as required by other techniques.

Embodiments of the present invention allow for back to front electrical connections in a very simple wafer-level CSP process. This process does not require an assembly procedure for back-to-front drain connections. Prior art processes, by contrast, use assembly procedures that require more materials consumption and more machines.

In addition, the process described herein is very flexible at any die size without requiring tooling change for different sized die. Prior art techniques, by contrast, require either a new metal frame tool up or BGA mask change for different sized die, in addition to a machine conversion kit change, all of which can be very expensive. Further the difficulty of wafer warpage that occurs in many prior art wafer level chip-scale package (WLCSP) structures and processes due to thermal mismatch between the wafer and wafer back side coating material is no more a concern here because the above-described process saw the wafer into small chips before coating them with conductive material. This greatly reduces the potential thermal stress mismatch of wafer and coated material.

The process described herein is applicable to any vertical semiconductor device. It is applicable to any lateral semiconductor device that has an electrical region exposed at the top and at the bottom, such as insulated-gate bipolar transistor (IGBT) or bottom source lateral double-diffused MOSFET (BS-LDMOSFET). The BS-LDMOSFET has the gate and drain at the bottom, and the source (substrate) exposed at the top.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for making back-to-front electrical connections in a wafer level chip scale packaging process, comprising:
   a) mounting a wafer containing a plurality of semiconductor chips on a package substrate, wherein each semiconductor chip in the plurality includes one or more electrodes on an exposed back side;
   b) removing scribe lines between two or more adjacent chips on the wafer to form relatively wide gaps therebetween;
   c) applying an uncovered layer of conductive material to the back side of the semiconductor chips and in the gaps coating over the exposed back side and side wall surfaces of each semiconductor chip forming an outmost surface, wherein side layers of conductive material further extend to the edges of a front side of each semiconductor chip; and
   d) cutting through the conductive material in the gaps between two or more of the chips leaving conductive material on the back side and on side walls of the two or more chips,
   whereby the conductive material provides an electrical connection from the electrode on the back side of the chip to the front side of the chip, wherein side layers of conductive material further extends to the edges of a front side of each semiconductor chip.

2. The method of claim 1 wherein each semiconductor chip in the plurality includes a front side surface patterned with a land-grid array (LGA).

3. The method of claim 1 wherein a) includes using a thick-bladed wafer saw to remove the scribe lines between the two or more adjacent chips.

4. The method of claim 3, wherein the thick-bladed wafer saw has a blade thickness of about 80 µm to 100 µm.

5. The method of claim 1, wherein the conductive material comprises a conductive epoxy.

6. The method of claim 1, wherein the conductive material comprises a cast conductive material.

7. The method of claim 1 wherein d) includes using a thin-bladed wafer saw to cut through the conductive material between the two or more of the chips.

8. The method of claim 7 wherein the thin-bladed wafer saw has a blade thickness of about 20 µm to 30 µm.

9. The method of claim 1 wherein the plurality of semiconductor chips include one or more vertical metal oxide silicon field effect transistors (MOSFETs).

10. The method of claim 9 wherein the one or more vertical metal oxide silicon field effect transistors (MOSFETs) include one or more trench MOSFETs.

11. The method of claim 9 wherein the one or more electrodes on the exposed back side include one or more drain electrodes.

12. The method of claim 1 wherein the one or more electrodes on the exposed back side comprises a standard back side metal.

13. The method of claim 1 wherein the one or more electrodes on the exposed back side comprises an exposed back-side portion of a substrate of the wafer.

14. The method of claim 13, further comprising: before removing the scribe lines, doping and annealing the exposed back side portion.

15. The method of claim 13 further comprising: before applying the conductive material, cleaning a surface of the wafer.

16. A chip scale semiconductor package comprising:
   a power semiconductor chip including one or more electrodes on its back side and its front side;
   an uncovered layer of conductive material coating over the semiconductor chip back side and side wall surfaces of said semiconductor chip forming an outmost surface of the package, wherein side layers of conductive material further extend to the edges of said front side.

17. The package of claim 16 wherein the layer of conductive material covers four side walls of said semiconductor chip.

18. The package of claim 16 wherein the front side surface is patterned with a land-grid array (LGA).

19. The package of claim 16 wherein the semiconductor chip include vertical metal oxide silicon field effect transistors (MOSFETs).

20. The package of claim 16 wherein the semiconductor chip includes a lateral MOSFET chip which has a gate and a drain on the front side of the semiconductor chip and a source exposed on the back side of the semiconductor chip.

21. The package of claim 16 wherein the semiconductor chip include insulated-gate bipolar transistors (IGBT).

22. The method of claim 1 wherein the gaps formed in b) extend through the entire wafer.

* * * * *